United States Patent
Andenna et al.

(10) Patent No.: US 9,105,680 B2
(45) Date of Patent: Aug. 11, 2015

(54) INSULATED GATE BIPOLAR TRANSISTOR

(71) Applicant: ABB TECHNOLOGY AG, Zürich (CH)

(72) Inventors: Maxi Andenna, Fislisbach (CH); Munaf Rahimo, Uezwil (CH); Chiara Corvasce, Bergdietikon (CH); Arnost Kopta, Zürich (CH)

(73) Assignee: ABB TECHNOLOGY AG, Zurich (CH)

( * ) Notice: Subject to any disclaimer, the term of this patent is extended or adjusted under 35 U.S.C. 154(b) by 53 days.

(21) Appl. No.: 14/149,412

(22) Filed: Jan. 7, 2014

(65) Prior Publication Data

US 2014/0124829 A1  May 8, 2014

Related U.S. Application Data

(63) Continuation of application No. PCT/EP2012/063303, filed on Jul. 6, 2012.

(30) Foreign Application Priority Data

Jul. 7, 2011 (EP) ..................... 11173059

(51) Int. Cl.
*H01L 29/732* (2006.01)
*H01L 29/739* (2006.01)
(Continued)

(52) U.S. Cl.
CPC ........ *H01L 29/7397* (2013.01); *H01L 29/1095* (2013.01); *H01L 29/66348* (2013.01); *H01L 29/7395* (2013.01)

(58) Field of Classification Search
CPC ............ H01L 29/7397; H01L 29/1095; H01L 29/66348; H01L 29/66333
USPC .................. 438/138, 350, 370; 257/592
See application file for complete search history.

(56) References Cited

U.S. PATENT DOCUMENTS 5,679,966 A * 10/1997 Baliga et al. ............... 257/139
2007/0063269 A1* 3/2007 Ng et al. ..................... 257/330
(Continued)

FOREIGN PATENT DOCUMENTS

EP   1 032 047 A2   8/2000
EP   1 895 595 A2   3/2008
(Continued)

OTHER PUBLICATIONS

International Search Report (PCT/ISA/210) mailed on Sep. 19, 2012, by the European Patent Office as the International Searching Authority for International Application No. PCT/EP2012/063303.
(Continued)

*Primary Examiner* — George Fourson, III
(74) *Attorney, Agent, or Firm* — Buchanan Ingersoll & Rooney PC

(57) ABSTRACT

An IGBT has layers between emitter and collector sides. The layers include a collector layer on the collector side, a drift layer, a base layer of a second conductivity type, a first source region arranged on the base layer towards the emitter side, a trench gate electrode arranged lateral to the base layer and extending deeper into the drift layer than the base layer, a well arranged lateral to the base layer and extending deeper into the drift layer than the base layer, an enhancement layer surrounding the base layer so as to completely separate the base layer from the drift layer and the well, an electrically conducting layer covering the well and separated from the well by a second electrically insulating layer, and a third insulating layer having a recess on top of the electrically conducting layer such that the electrically conducting layer electrically contacts a emitter electrode.

20 Claims, 6 Drawing Sheets

(51) Int. Cl.
    *H01L 29/10*    (2006.01)
    *H01L 29/66*    (2006.01)

(56) References Cited

U.S. PATENT DOCUMENTS

| | | | |
|---|---|---|---|
| 2007/0108468 A1 | 5/2007 | Takahashi | |
| 2012/0007139 A1 | 1/2012 | Tanaka | |
| 2013/0026537 A1* | 1/2013 | Rahimo et al. | 257/139 |
| 2014/0124829 A1* | 5/2014 | Andenna et al. | 257/139 |
| 2014/0124831 A1* | 5/2014 | Rahimo et al. | 257/139 |
| 2014/0339600 A1* | 11/2014 | Yoshikawa | 257/139 |
| 2015/0014742 A1* | 1/2015 | Lu | 257/139 |

FOREIGN PATENT DOCUMENTS

| | | |
|---|---|---|
| JP | 2011-040586 A | 2/2011 |
| WO | WO 2010/109596 A1 | 9/2010 |

OTHER PUBLICATIONS

Written Opinion (PCT/ISA/237) mailed on Sep. 19, 2012, by the European Patent Office as the International Searching Authority for International Application No. PCT/EP2012/063303.

European Search Report for EP 11173059.4 dated Dec. 7, 2011.

* cited by examiner

INSULATED GATE BIPOLAR TRANSISTOR

RELATED APPLICATIONS

This application claims priority as a continuation application under 35 U.S.C. §120 to PCT/EP2012/063303, which was filed as an International Application on Jul. 6, 2012 designating the U.S., and which claims priority to European Application 11173059.4 filed in Europe on Jul. 7, 2011. The entire contents of these applications are hereby incorporated by reference in their entireties.

FIELD

The present disclosure relates to the field of power semiconductor devices. More particularly, the present disclosure relates to an Insulated Gate Bipolar Transistor (IGBT).

BACKGROUND INFORMATION

FIG. 1 shows a known IGBT 120 with planar gate electrodes. The IGBT 120 is a device with a four-layer structure, which layers are arranged between an emitter electrode 2 on an emitter side 11 and a collector electrode 25 on a collector side 15, which is arranged opposite of the emitter side 11. An (n−) doped drift layer 8 is arranged between the emitter side 11 and the collector side 15. A p doped base layer 4 is arranged between the drift layer 8 and the emitter electrode 2. The base layer 4 is in direct electrical contact with the emitter electrode 2. An n-doped source region 7 is arranged on the emitter side 11 embedded into the planar base layer 4 and contacts the emitter electrode 2.

A planar gate electrode 31 is arranged on top of the emitter side 11. The planar gate electrode 31 is electrically insulated from the base layer 4, the first source region 7 and the drift layer 8 by a first insulating layer 34. There is a third insulating layer 38 arranged between the planar gate electrode 31 and the emitter electrode 2. On the collector side, a collector layer 9 is arranged between the drift layer 8 and the collector electrode 25.

Such a planar MOS cell design exhibits a number of disadvantages when applied to BiMOS type switch concepts. The device has high on-state losses due to a plurality of effects. The planar design offers a lateral MOS channel which suffers from carrier spreading (also called JFET effect) near the cell. Therefore, the planar cells show low carrier enhancement. Furthermore, due to the lateral channel design, the planar design also suffers from the hole drain effect (PNP effect) due to the lateral electron spreading out of the MOS channel. The region between the cells offers strong charge enhancement for the PiN diode part. This PiN effect, however, can only show a positive impact in high voltage devices with low cell packing densities (a low number of cells within an area). In order to achieve reduced channel resistance, the planar devices are made with less cell packing density, and this can only be compensated with narrow pitches (distance between two cells), thereby reducing the PiN effect.

The high losses have been reduced by the introduction of n doped enhancement layers, which surround the planar base layer.

Concerning the blocking capability, the planar design provides good blocking capability due to low peak fields in the cells and between the cells.

The planar design can have a large MOS accumulation region below the gate electrode and large associated capacitance. Nevertheless, the device shows good controllability due to the application of a field oxide type layer between the cells for miller capacitance reduction. Therefore, good controllability and low switching losses can be achieved for planar design.

Furthermore, the cell densities in planar designs can be easily adjusted for the required short circuit currents.

As a result taking all the above mentioned effects into account, known planar cells apply very narrow cells and wide pitches with Field Oxide layers.

Alternatively to planar designs, known IGBTs 130 having trench MOS cell designs as shown in FIG. 2 have been introduced, in which a trench gate electrode 3 is electrically insulated from a base layer 4, a first source region 7 and the drift layer 8 by a first insulating layer 34. The trench gate electrode 3 is arranged in the same plane and lateral to the base layer 4 and extends deeper into the drift layer 8 than the base layer 4.

With such trench gate electrode designs, the on-state losses are lower, because the trench design offers a vertical MOS channel, which provides enhanced injection of electrons in the vertical direction and suffers from no drawbacks from charge spreading (so called JFET effect) near the cell. Therefore, the trench cells show much improved carrier enhancement for lower losses. Due to the vertical channel design, the trench also offers less hole drain effect (PNP effect) due to the improved electron spreading out of the MOS channel. At the bottom of the trench, there is an accumulation layer, which offers strong charge enhancement for the PIN diode part. Hence, wide and/or deep trenches show optimum performance. The trench design offers large cell packing density for reduced channel resistance. The trench design, however, suffers from lower blocking capability near the bottom corners of the trenches due to high peak electric fields. The trench design has a large MOS accumulation region and associated capacitance with difficulty to apply field oxide type layers in the trench for miller capacitance reduction. Therefore, the device results in poor controllability and high switching losses. Furthermore, the high cell densities in trench designs will result in high short circuit currents.

In order to reduce the above mentioned effects, the trench gate electrodes have been made wide and deep, whereas the cells have to be made narrow, so that losses are reduced and short circuit current can be kept low. However, such trenches are difficult to process and will still suffer from bad controllability.

In another known concept shown in FIG. 3, IGBTs 140 having a pitched-trench gate electrode 300 design have been applied, in which a MOS area is inserted between the cells. The two trench gate electrodes 3 are connected by a layer made of the same material as the trench gate electrodes, thereby forming an area below, in which a part of the base layer is arranged, but no source region or contact of the base layer to the emitter electrode is available in this MOS area. However, such devices result in poor blocking properties and high switching losses due to slow field spreading from the pitched area during switching (FIG. 3).

In another approach shown in FIG. 4, dummy trench cells 110 have been introduced into another known IGBT 150, in which active cells 100 and dummy cells 110 are arranged in an alternating manner. The base layer 4 and first source regions 7 do not have a contact with the emitter electrode 2 in the dummy cell 110, However, similar problems to those mentioned for the pitched-trench design apply. For this design, n doped enhancement layers can be introduced between the drift layer 8 and the base layer 4 in order to reduce on-state losses.

In JP 2011-40586, another known IGBT 160 shown in FIG. 5 having trench gate electrodes is described. Between two active trenches 3, shallow pitched trenches 300 with an upper lying planar layer of the same electrically conductive poly silicon material are arranged, which do not have a contact with the emitter electrode 2 similar to the known IGBT 140 shown in FIG. 3. However, as one base layer 4 is applied in the active cells as well as in the pitched gate area below the shallow pitched trenches 300, this base layer 4 has to be rather deep because the pitched gate electrodes 300 are embedded in the base layer 4, whereas the active trenches 3 are deeper than the base layer 4. The manufacturing of such trenches 3, 300 with different depths and the deep p base layer 4 is difficult, because the active trenches 3 and the pitched trenches have to be manufactured separately. Furthermore, the deep p base layer 4 is connected to the active trenches 3, which has a negative impact on the device turn-on behaviour in terms of controllability.

SUMMARY

An exemplary embodiment provides an insulated gated bipolar transistor (IGBT) having layers between an emitter electrode on an emitter side and a collector electrode on a collector side opposite to the emitter side. The exemplary IGBT includes a drift layer of a first conductivity type, and a collector layer of a second conductivity type different than the first conductivity type. The collector layer is arranged between the drift layer and the collector electrode and electrically contacts the collector electrode. The exemplary IGBT also includes a base layer of a second conductivity type, where the base layer is arranged between the drift layer and the emitter electrode, and the base layer electrically contacts the emitter electrode. In addition, the exemplary IGBT includes a first source region of the first conductivity type. The first source region is arranged on the base layer towards the emitter side and electrically contacts the emitter electrode. The first source region has a higher doping concentration than the drift layer. The exemplary IGBT also includes a trench gate electrode arranged lateral to the base layer and extending deeper into the drift layer than the base layer. The trench gate electrode is separated from the base layer, the first source region and the drift layer by a first insulating layer. A channel is formable between the emitter electrode, the first source region, the base layer and the drift layer. Furthermore, the exemplary IGBT includes a well of the second conductivity type, which is arranged lateral to the base layer and extends deeper into the drift layer than the base layer. In addition, the exemplary IGBT includes an enhancement layer of the first conductivity type, which surrounds the base layer such that the enhancement layer completely separates the base layer from the drift layer and the well. In addition to the emitter electrode, the IGBT includes an electrically conducting layer, which covers the well. The electrically conductive layer is separated from the well by a second electrically insulating layer. The exemplary IGBT also includes a third insulating layer, which is arranged on the emitter side on top of the trench gate electrode, the electrically conductive layer and those parts of the base layer, the enhancement layer and the drift layer lying between the trench gate electrode and the well. The third insulating layer has a recess on top of the electrically conducting layer such that the electrically conducting layer electrically contacts the emitter electrode.

An exemplary embodiment of the present disclosure provides a method for manufacturing an insulated gated bipolar transistor. The exemplary method includes providing a lowly doped wafer of a first conductivity type having an emitter side and a collector side, where part of the wafer has unamended low doping in the finalized insulated gated bipolar transistor forming a drift layer. The exemplary method also includes applying a mask and introducing a first dopant of a second conductivity type, which is different than the first conductivity type, for forming a well, and making a trench recess on the emitter side. In addition, the exemplary method includes coating the trench recess with a first insulating layer and filling the coated trench recess with an electrically conductive material such that a trench gate electrode is formed. Furthermore, the exemplary method includes forming a second insulating layer which covers the well, forming an electrically conductive layer on top of the second insulating layer, and creating an enhancement layer by introducing a second dopant of the first conductivity type and diffusing the second dopant into the wafer using the electrically conductive layer as a mask. After introduction of the second dopant, the exemplary method includes creating a base layer by introducing a third dopant of the second conductivity type, using the electrically conductive layer as a mask, and diffusing the third dopant into the wafer to a lower depth from the emitter side, into which the second dopant has been diffused. In addition, the exemplary method includes creating a collector layer by introducing a fourth dopant of the second conductivity type on the collector side, and diffusing the fourth dopant into the wafer. Furthermore, the exemplary method includes introducing a fifth dopant of the first conductivity type using at least the electrically conductive layer as a mask for forming first source regions. The exemplary method also includes applying a third insulating layer on top of the electrically conductive layer. The third insulating layer has a recess on the electrically conductive layer for a contact of the electrically conductive layer to the emitter electrode and a contact opening to the base layer. In addition, the exemplary method includes applying an emitter electrode and a collector electrode.

DETAILED DESCRIPTION OF THE DRAWINGS

Additional refinements, advantages and features of the present disclosure are described in more detail below with reference to exemplary embodiments illustrated in the drawings, in which.

The reference symbols used in the drawings and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
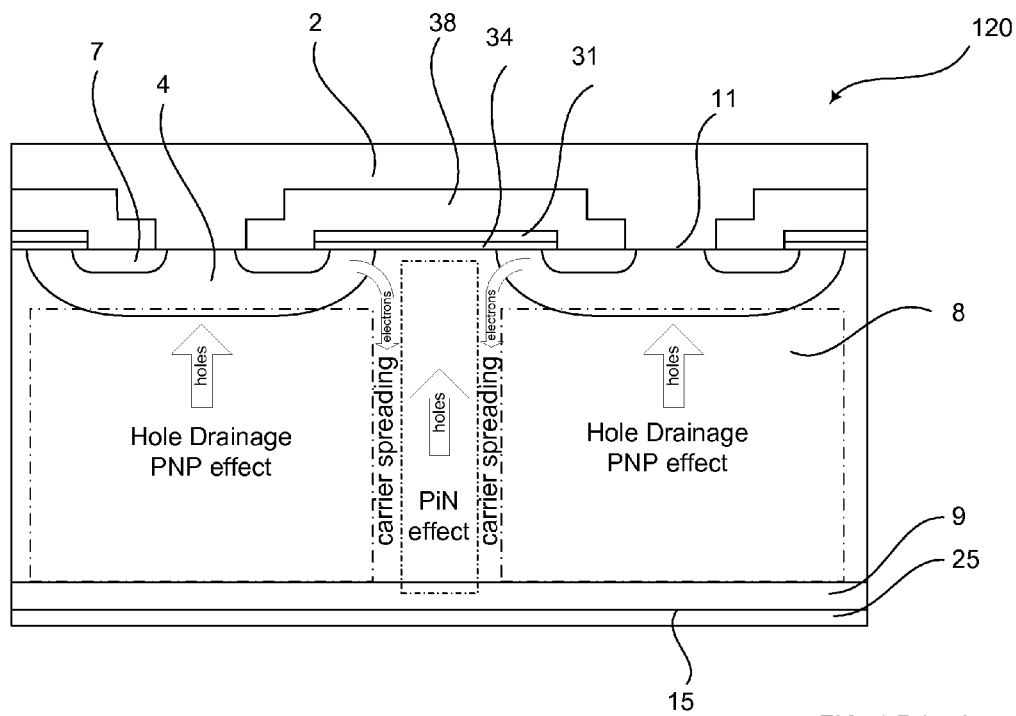
FIG. 1 shows a known IGBT with a planar gate electrode.
Figure 2:
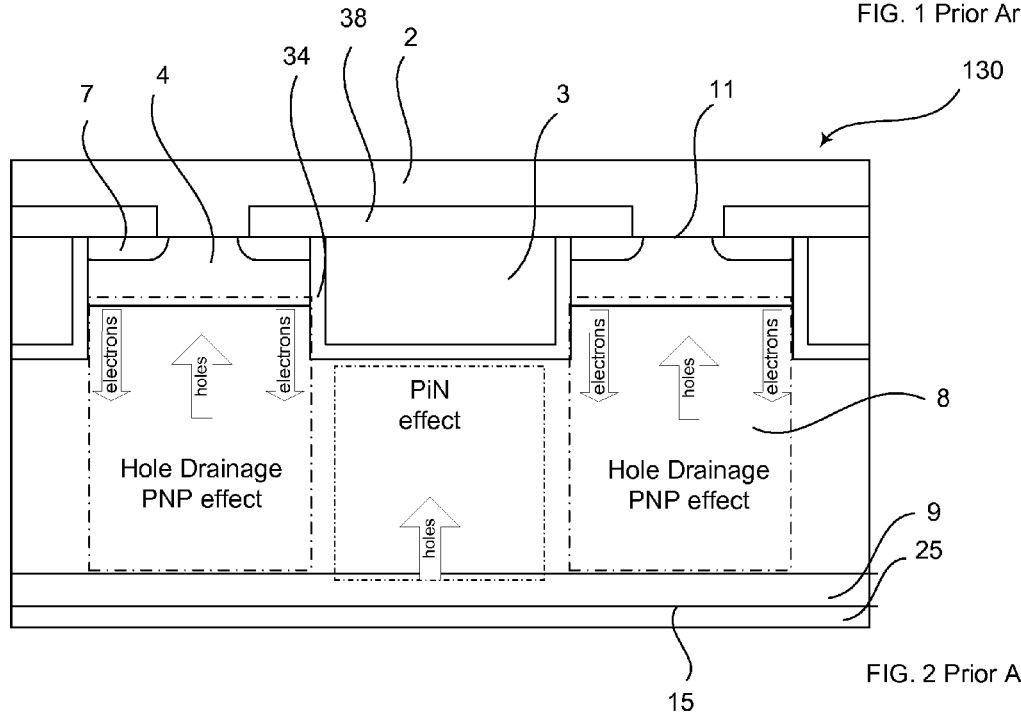
FIG. 2 shows a known IGBT with a trench gate electrode.

Exemplary embodiments of the present disclosure provide a power semiconductor device, such as an insulated gated bipolar transistor (IGBT), with reduced on-state losses, improved blocking capability, low drainage of holes and good controllability, which is easier to manufacture than known devices.

According to an exemplary embodiment, the IGBT has layers between an emitter electrode on an emitter side and a collector electrode on a collector side opposite to the emitter side. The IGBT includes a drift layer of a first conductivity type, and a collector layer of a second conductivity type different than the first conductivity type, where the collector layer is arranged between the drift layer and the collector electrode, and electrically contacts the collector electrode. The IGBT also includes a base layer of a second conductivity type, which is arranged between the drift layer and the emitter electrode, where the base layer is in direct electrical contact with the emitter electrode. In addition, the IGBT includes a first source region of the first conductivity type having a higher doping concentration than the drift layer. The first source region is arranged on the base layer towards the emitter side and contacts the emitter electrode. The IGBT also includes at least one trench gate electrode, which is arranged lateral to the base layer and extends deeper into the drift layer than the base layer. The trench gate electrode is separated from the base layer, the first source region and the drift layer by a first insulating layer. A channel is formable between the emitter electrode, the first source region, the base layer and the drift layer. Further, the IGBT includes a well of the second conductivity type, which is arranged lateral to the base layer and extends deeper into the drift layer than the base layer. In addition, the IGBT includes an enhancement layer of the first conductivity type, which surrounds the base layer such that the enhancement layer completely separates the base layer from the drift layer and the well. In addition to the emitter electrode, the IGBT includes an electrically conducting layer, which covers the well and is separated at least from the well by a second electrically insulating layer. The IGBT also includes a third insulating layer, which is arranged on the emitter side on top of the trench gate electrode, the electrically conductive layer and those parts of the base layer, the enhancement layer and the drift layer lying between the trench gate electrode and the well. The third insulating layer has a recess on top of the electrically conducting layer such that the electrically conducting layer electrically contacts the emitter electrode.

This structure combines the positive effects of known devices by having the deep well between two active cells, which ensures good blocking performance, improved controllability and low switching losses. Furthermore, the deep well is separated from the base layer by the enhancement layer for better turn-on behavior. The enhancement layer itself also has the advantage that the on-state losses are reduced. As the electrically conductive layer is on the potential of the emitter electrode, it does not play a negative role by adding a capacitive effect in the gate circuit and hence, improved switching is obtained with lower losses and good controllability.

For the creation of the IGBT according to the present disclosure, no complicated steps like trenches having different depths are used. The IGBT of the present disclosure has good electrical properties for both the static and dynamic characteristics.

Furthermore, the device is easy to manufacture, because the design of the power semiconductor device of the present disclosure can be manufactured based on a self-aligned process for the base layer and the enhancement layer between the well and the gate and, if present, for a second source region with the potential of applying the emitter sided structure also on other IGBT device types like reverse conducting designs in a number of possible combinations. The design of the IGBT of the present disclosure is suitable for full or part stripes but can also be implemented in cellular designs. The electrically conductive layer is used as a mask for the creation of the enhancement layer and the base layer (self alignment), which is advantageous, because no mask alignment is needed (as it is the case for a mask that is only applied for the creation of these layers and removed afterwards) and the mask does not have to be removed for finalizing the device.

Further advantages according to the present disclosure will be apparent from the following description of exemplary embodiments.

Figure 3:
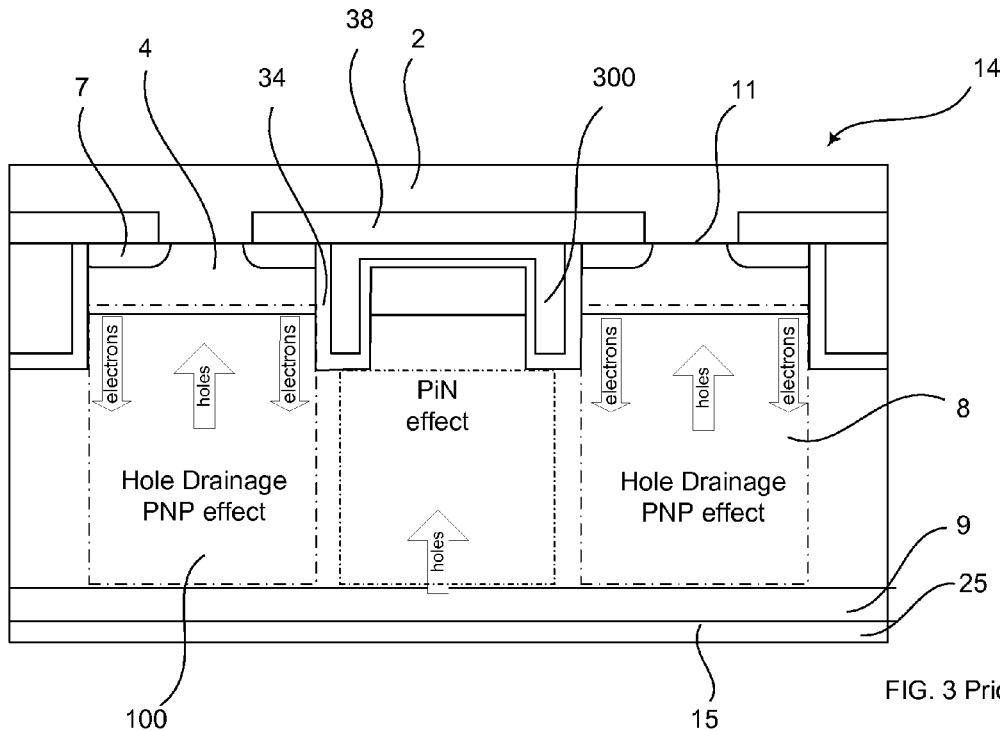
FIG. 3 shows another known IGBT with a pitched trench gate electrode.
Figure 4:
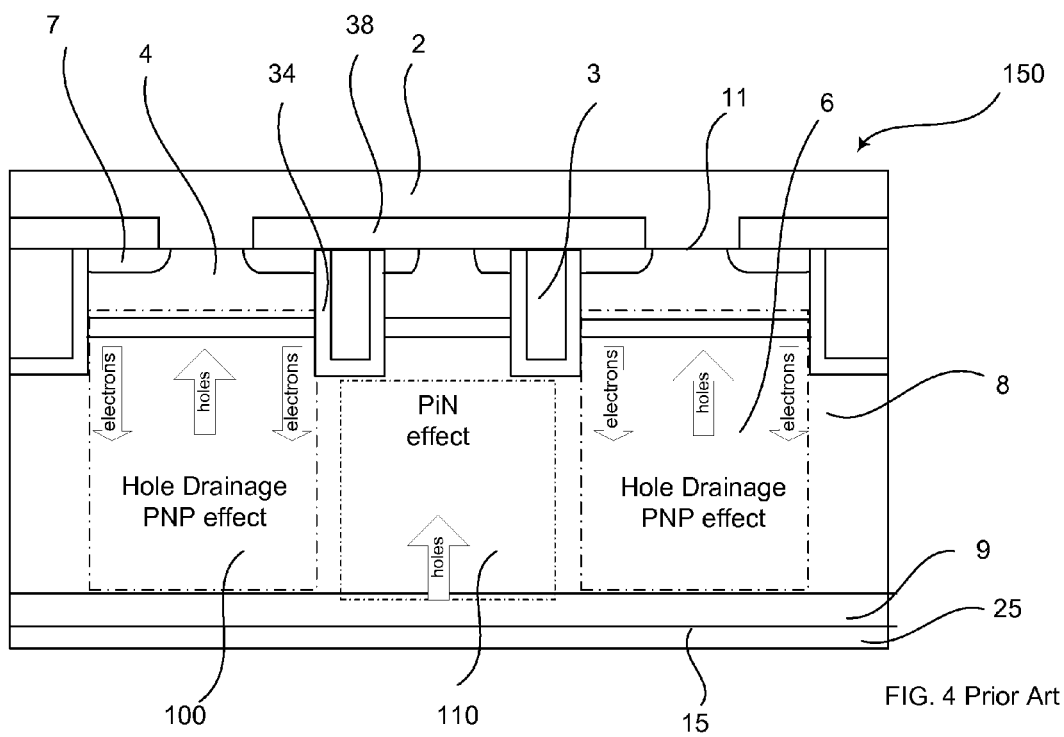
FIG. 4 shows a known IGBT with a dummy cell.
Figure 5:
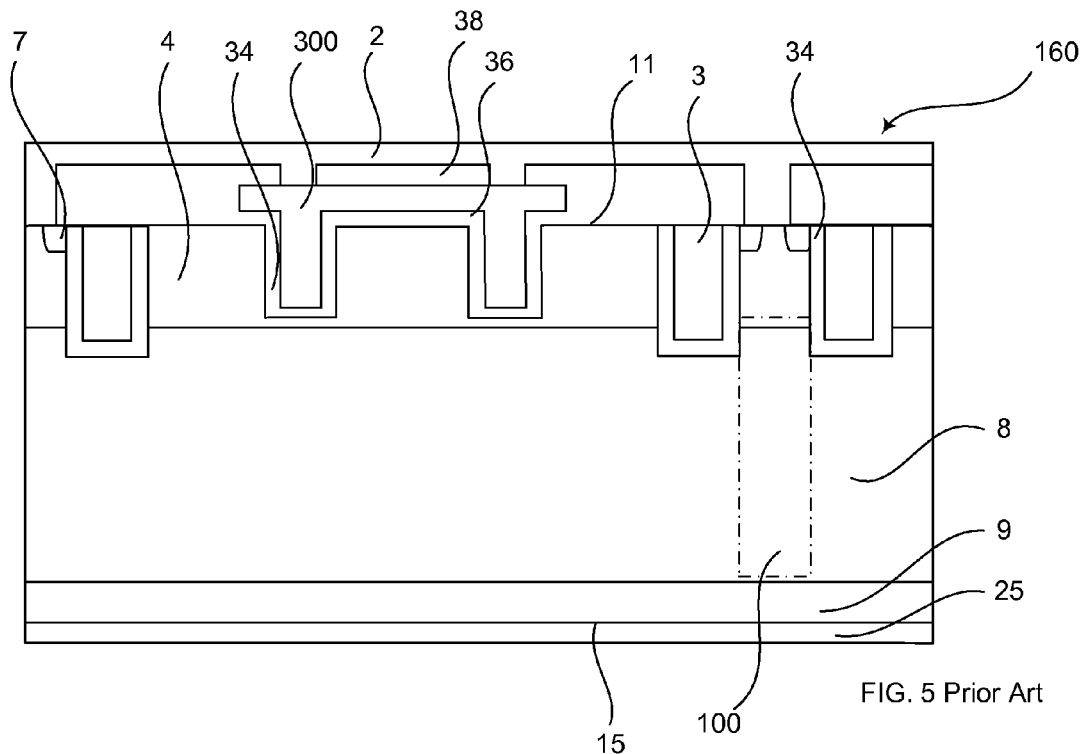
FIG. 5 shows another known IGBT with a pitched trench gate electrode.
Figure 6:
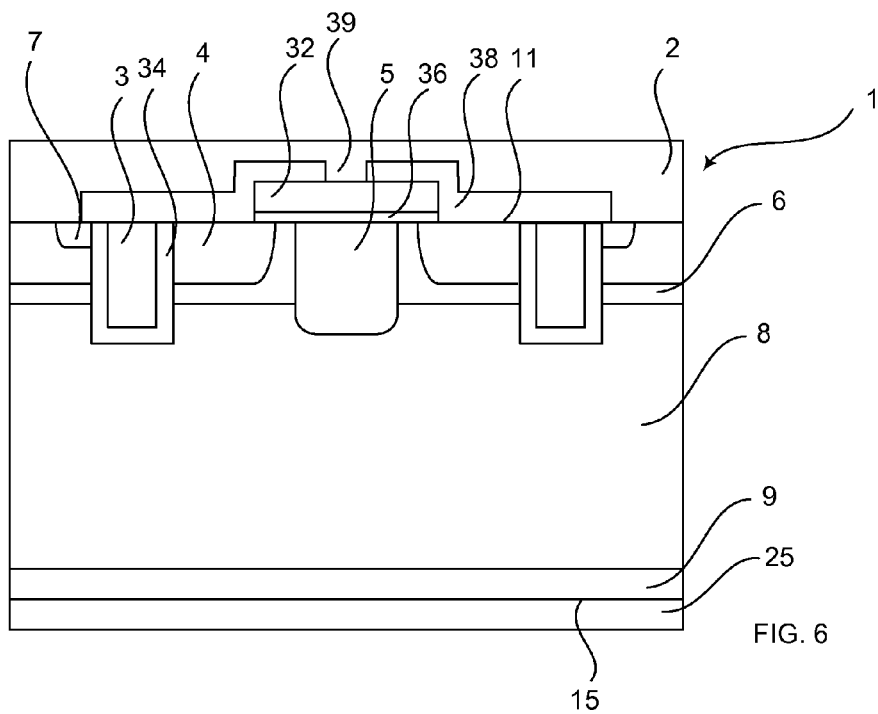
FIG. 6 shows an exemplary embodiment of an IGBT according to the present disclosure.
Figure 12:
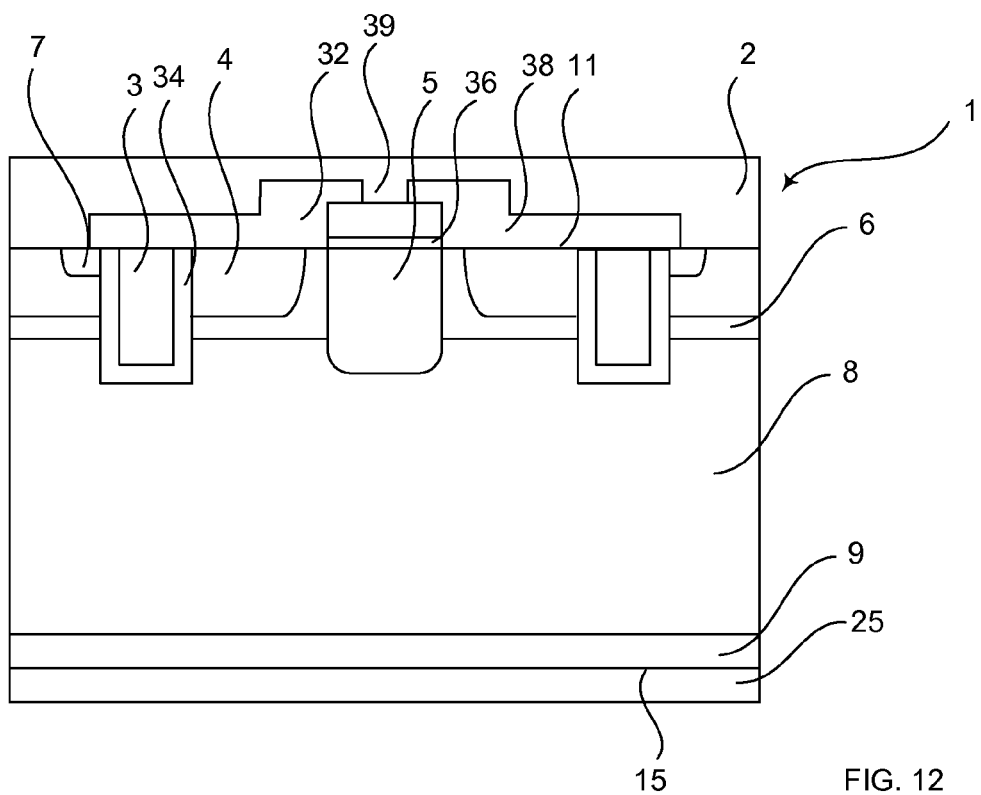

FIG. 6 shows an exemplary embodiment of a power semiconductor device 1 in the form of an insulated gate bipolar transistor (IGBT) with a four-layer structure (pnpn). The layers are arranged between an emitter electrode 2 on an emitter side 11 and a collector electrode 25 on a collector side 15, which is arranged opposite of the emitter side 11. The IGBT includes the following layers. An (n−) lowly doped drift layer 8 is arranged between the emitter side 11 and the collector side 15. According to an exemplary embodiment, the drift layer has a constant, uniform low doping concentration. A p doped collector layer 9 is arranged between the drift layer 8 and the collector electrode 25. The collector layer 9 is arranged adjacent to and electrically contacts the collector electrode 25. A p doped base layer 4 is arranged between the drift layer 8 and the emitter electrode 2. The base layer 4 is in direct electrical contact with the emitter electrode 2. An n doped first source region 7 is arranged on the base layer 4 towards the emitter side 11 and contacts the emitter electrode 2. The first source region 7 has a higher doping concentration than the drift layer 8. With the first source region 7 being arranged on top of the base layer 4, it is meant that the first source region 7 is arranged at the surface at the emitter side 11. The first source region 7 can be embedded in the base layer 4 such that both layer have a common surface on the emitter side 11. A trench gate electrode 3 or a plurality, i.e. at least two trench gate electrodes 3 are arranged in the same plane (which plane lies parallel to the emitter side 11) and lateral to the base layer 4 and extends deeper into the drift layer 8 from the emitter side 11 than the base layer 4. The trench gate electrode 3 is separated from the base layer 4, the first source region 7 and the drift layer 8 by a first insulating layer 34. A channel is formable between the emitter electrode 2, the first source region 7, the base layer 4 and the drift layer 8. The trench gate electrodes can have any design well-known to the experts like cellular design, full or part stripes. A p doped well 5 is arranged in the same plane and lateral to the base layer 4 and extends deeper into the drift layer 8 than the base layer 4. The p well 5 is not connected to the p base layer 4. An n doped enhancement layer 6, which is higher doped than the drift layer 8, surrounds the base layer 4 such that the enhancement layer 6 completely separates the base layer 4 from the drift layer 8 and the well 5. Exemplarily, the enhancement layer 6 is shallower than the well 5. In addition to the emitter electrode 2, an electrically conducting layer 32 is arranged on the emitter side 11, which covers the well 5 (FIG. 12). Additionally, the electrically conductive layer 32 can cover such part of the enhancement layer 6, which is arranged between the well 5 and the base layer 4, and extends to a region above the base layer 4. If the drift layer extends to the surface on the emitter side 11, the drift layer 8 is also covered by the electrically conductive layer 32 in this embodiment. For manufacturing such a device, the second electrically insulating layer 36 and/or the electrically conductive layer 32 can be used as a mask, therefore simplifying the manufacturing. The electrically conductive layer 32 can be made of any suitable electrically conductive material, exemplarily polysilicon or metal. A second electrically insulating layer 36 separates the electrically conducting layer 32 from the well 5 and the other layers 4, 6, respectively. This second insulating layer 36 can be chosen as thin as 50 to 150 nm, which is much thinner than the insulating layers 38 used in known devices like those shown in FIGS. 3 and 4, which have a third insulating layer 38 in form of a silicon oxide layer with a thickness of 500 to 1500 nm. By having such a thin second insulating layer the capacitance is positively reduced and thereby, the switching capability is improved. A third insulating layer 38 is arranged on the emitter side 11 on top of the trench gate electrode 3, the electrically conductive layer 32 and those parts of the base layer 4, the enhancement layer 6 and the drift layer 8, which extend to the emitter side 11 between a trench gate electrode 3 and the well 5. The third insulating layer 38 has a recess 39 on top of the electrically conducting layer 32, i.e. on such a side of the layer 32 which lies opposite to the second insulating layer 38, such that the electrically conducting layer 32 is in electrical contact with the emitter electrode 2.

"Lateral" shall mean in this description that two layers/regions are arranged in a same plane, which plane lies parallel to the emitter side. Within that plane the layers are arranged lateral (neighbored, side to side) or adjacent to each other, whereas the layers can have a distance from each other, i.e. another layer can be arranged between the two layers, but they can also be directly adjacent to each other, i.e. in touch to each other. "Lateral sides" of a layer shall be the sides of an object perpendicular to the emitter side 11.

In FIGS. 7 to 12, IGBTs similar to the one shown in FIG. 6 are disclosed, but these IGBTs include additional features as explained below in more detail.

Figure 7:
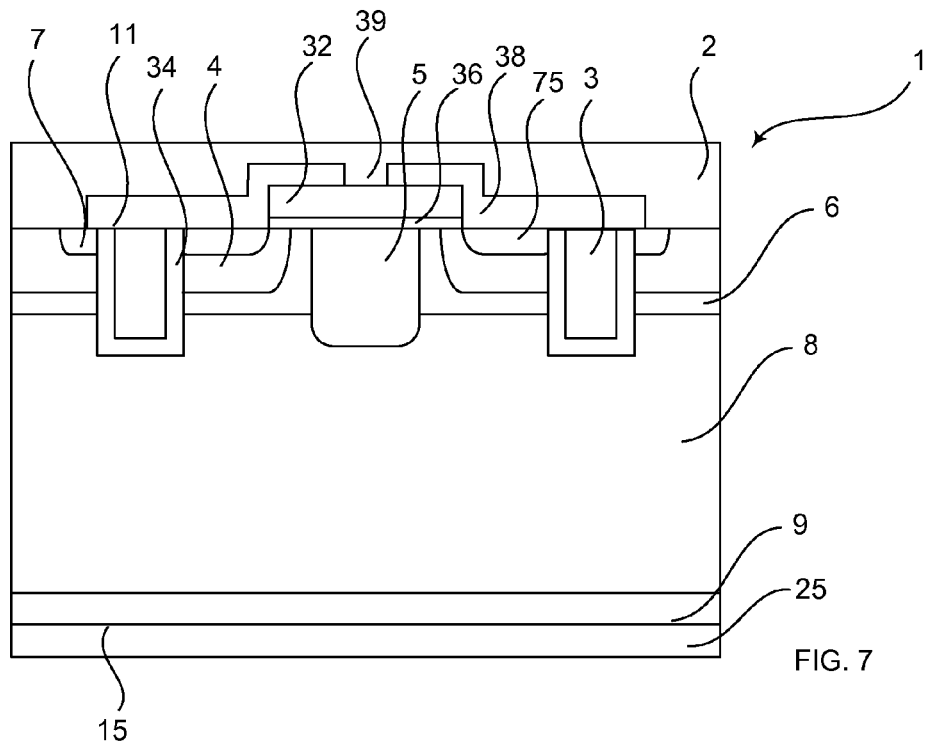
FIGS. 7 to 12 show exemplary embodiments of IGBTs according to the present disclosure.

In the exemplary IGBT shown in FIG. 7, a second n doped source region 75 is arranged at the emitter side 11 on the base layer 4 between the trench gate electrode 3 and the well 5, wherein the second source region 75 exemplarily extends from the first electrically insulating layer 34 at least to a border of the electrically conductive layer 32. The second source region 75 is exemplarily created together with the first source region 7, thus reducing the masking steps during manufacturing. The second source region 75 has a higher doping concentration than the drift layer 8.

Figure 8:
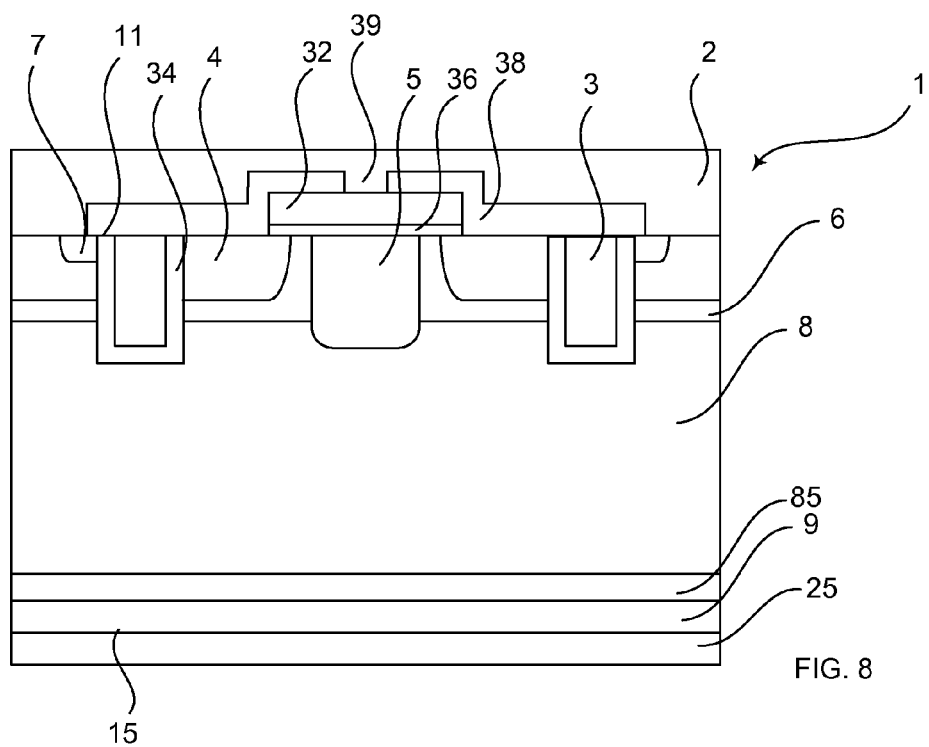

FIG. 8 shows another exemplary IGBT including an n doped buffer layer 85 having a higher doping concentration than the drift layer 8, which is arranged between the drift layer 8 and the collector layer 9.

Figure 9:
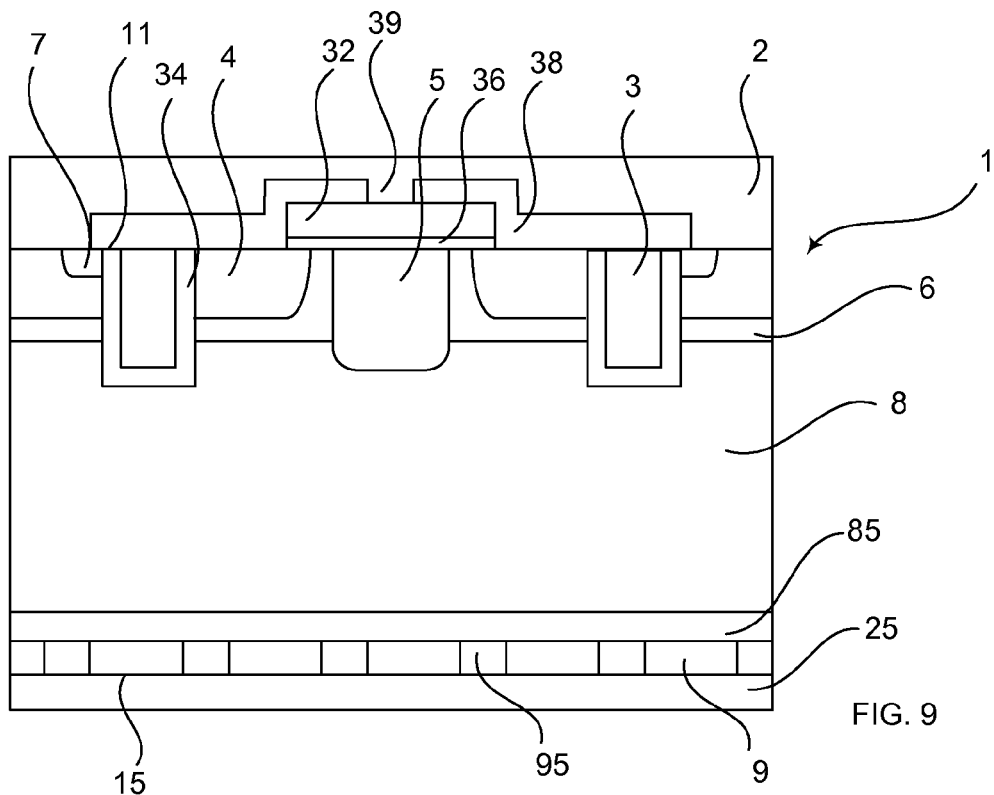

The emitter sided design of the present disclosure can also be applied to a reverse conducting IGBT, in which in the same plane as the collector layer 9 (i.e. on the collector side 15 and lateral to the collector layer 9), an n doped first region 95 is arranged as shown in FIG. 9. The first region 95 is thus arranged alternating to the collector layer 9. The first region 95 has a higher doping concentration than the drift layer 8.

The electrically conductive layer 32 can be made of the same material as the trench gate electrode 3. By its contact with the emitter electrode 2, the electrically conductive layer 32 is on the same potential as the emitter electrode 2. This layer is not controllable as a gate electrode. Thus, it has no negative impact on the switching performance due to an increased capacitive effect on the gate.

Figure 10:
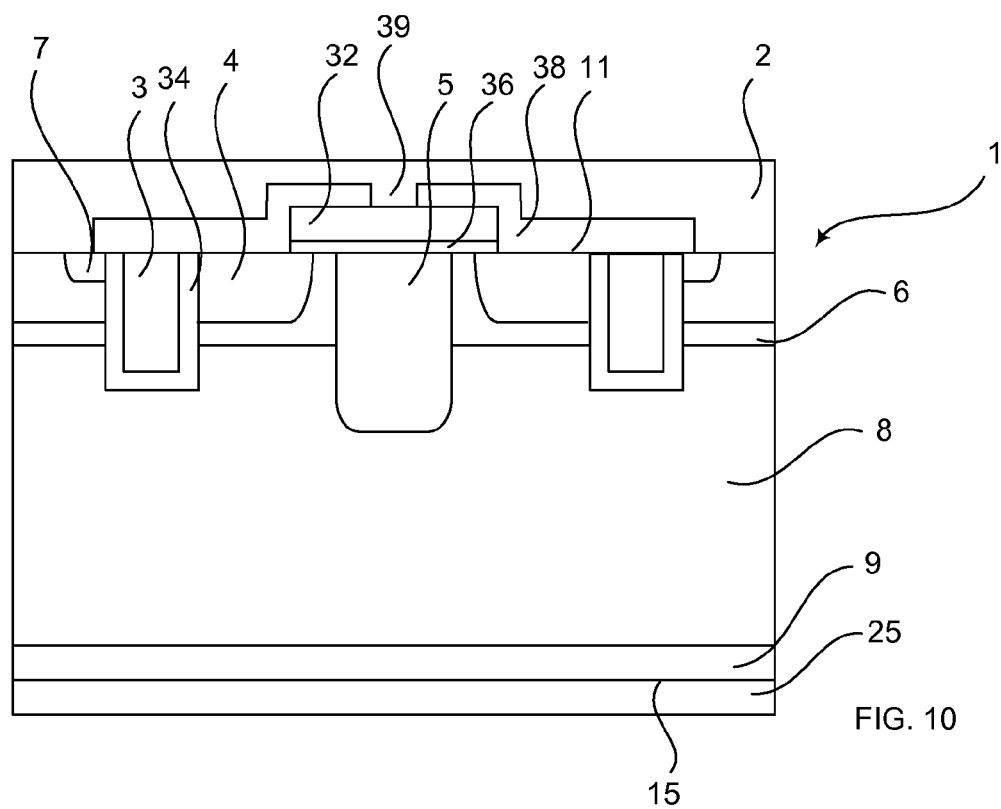

In an exemplary embodiment as shown in FIG. 10, the IGBT includes a p well 5, which extends deeper into the drift layer 8 than the trench gate electrode 3. This will provide improved blocking performance and lower switching losses.

Figure 11:
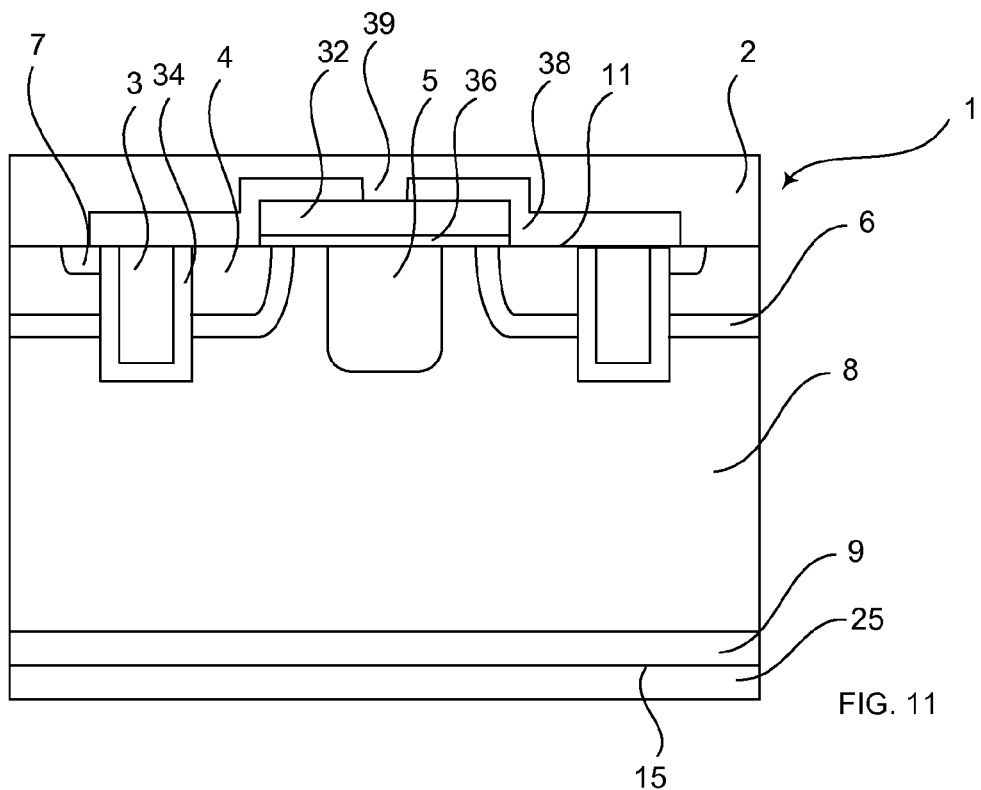

In FIGS. 6 to 10 and 12, the enhancement layer 6 adjoins the well 5 directly. Alternatively, as shown in FIG. 11, the drift layer 8 can extend to the insulation layer 36 in an area between the well 5 and the enhancement layer 6. In this embodiment, the drift layer 8 extends to the surface of the wafer so that the enhancement layer 6 and the well 5 are separated from each other by the drift layer 8. On state losses can be reduced by such an arrangement.

In an exemplary manufacturing method for this embodiment, the second insulating layer 36 and the electrically conductive layer 32 are used as a mask for the creation of the base layer 4 and the enhancement layer 6. In case of a wide electrically conductive layer 32 and a narrow well 5, the well 5 and the enhancement layer 6 become disposed from each other. Exemplarily, the semiconductor devices of the present include can include a gate electrode design with a different number of trench gate electrodes 3 than electrically conductive layers 32. For example, there can be less electrically conductive layers 32 than trench gate electrodes 3 arranged in the design so that the density of active cells 100 versus total area is increased. In another alternative, more than one p well 5 is arranged between the active trenches, wherein the wells 5 can be arranged below a common electrically conductive layer or the wells 5 can be arranged below separate electrically conductive layers 32, wherein the layers 32 are separated by the third insulating layer 38. Between two wells 5, the structure with the base layer 4 surrounded by the enhancement layer 6 can be repeated.

According to an exemplary embodiment, the IGBT 1 includes a p doped bar having a higher doping concentration than the base layer 4. The bar is arranged at the emitter side 11 in a plane perpendicular to the perspective shown in the FIGS. 6 to 12. At the bar the source regions 7, 75, base layer 4 and the enhancement layer 6 terminate. The bar extends to the surface of the wafer. The bar extends in a plane parallel to the emitter side perpendicular to the direction, in which the first source regions 7 attach the trench gate electrodes 3.

The well 5 can extend to the bar 45 or, alternatively it can be terminated such that no contact with the bar 45 is achieved. In this case, the enhancement layer 6 or the base layer 4 or both of these layers can be arranged between the well 5 and the bar 45. The connection between the well and the bar will result in a non-floating well which will increase the static losses and worsen the switching performance.

In another exemplary embodiment, the conductivity types are switched, i.e. all layers of the first conductivity type are p type (e.g. the drift layer 8, the first and second source region 7, 75), and all layers of the second conductivity type are n type (e.g. base layer 4, well 5).

The IGBT 1 of the present disclosure is manufactured by the following method. A lowly (n−) doped wafer having an emitter side and a collector side is provided. The wafer has a uniform, constant doping concentration. The wafer can be made on a basis of a silicon or GaN or SiC wafer. Part of the wafer having unamended low doping in the finalized insulated gated bipolar transistor 1 forms a drift layer 8.

A mask is applied and a first p dopant is introduced for forming a well 5.

A trench recess is introduced on the emitter side 11, which is coated with a first insulating layer 34. The coated trench recess is then filled with an electrically conductive material like a heavily doped polysilicon or a metal like aluminum, for example. By this step the trench gate electrode 3 is formed.

Afterwards, a second insulating layer 36, which covers the well 5, is formed. On top of this second insulating layer 36, an electrically conductive layer 32 is formed. This electrically conductive layer 32 can be formed of the same material as the trench gate electrode 3, but other electrically conductive materials can also be used. The electrically conductive layer 32 covers the well 5 and can extend laterally (e.g., in a plane parallel to the emitter side 11) beyond the well 5 so that the well is covered by the electrically conductive layer 32, but insulated from it by the second insulation layer 36. The electrically conductive layer 32 can exemplarily extend outside the well 5 by 1 to 10 μm, in another exemplary embodiment by 1 to 5 μm or by 5 to 10 μm. As the second insulating layer 36 insulates the electrically conductive layer 32 from the wafer, it extends laterally at least to the lateral sides of the electrically conductive layer 32 or even beyond its lateral sides.

Then, an enhancement layer 6 is formed by introducing an n second dopant on the emitter side 11, which is diffused into the wafer using the electrically conductive layer 32 as a mask.

After the introduction of the n second dopant, a base layer 4 is formed by introducing a p third dopant on the emitter side 11, using the electrically conductive layer 32 as a mask. The p third dopant is diffused into the wafer from the emitter side 11 to a lower depth than the depth into which the second dopant has been diffused so that the base layer 5 is embedded in the enhancement layer 6. Depending on the distance, which the electrically conductive layer 32 extends beyond the p well 5 and depending on the diffusion depth/length of the second and third dopants, the embodiments shown in the FIG. 6 (enhancement layer 6 extending to the p well 5, but separating the p well 5 from the base layer 4) or in FIG. 12, in which the enhancement layer 6 still separates the base layer 4 from the drift layer 8, but is separated from the p well 5 by the drift layer 8. In such a device, the third dopant is not laterally diffused so far as to reach the p well 5.

For example, a collector layer 9 is then formed by introducing a p fourth dopant on the collector side 15, which is diffused into the wafer. The collector layer 9 can also be made at another manufacturing step.

If a buffer layer 85 is created (see FIG. 8), the buffer layer 85 has to be created before the collector layer 9. The buffer layer 85 is exemplarily created by introducing an n dopant on the collector side 15. The buffer layer 85 always has higher doping concentration than the drift layer 8.

Then, a third insulating layer 38 is applied on top of the electrically conductive layer 32, which laterally extends to the trench gate electrode 3. The third insulating layer 38 is made with a recess 39 on the electrically conductive layer 32 for a contact of the electrically conductive layer 32 to the emitter electrode 2 and with a contact opening of the emitter electrode 2 to the base layer 4. The recess and contact opening are exemplarily made by partial removal of the third insulating layer 38 on top of the base layer and electrically conductive layer, respectively.

In the contact opening, a n fifth dopant is introduced using the third insulating layer 38 and the electrically conductive layer 32 as a mask for forming first source regions 7. For example, the fifth dopant is activated afterwards.

Alternatively, the electrically conductive layer 32 can be used as a mask for introducing the n fifth dopant. In this case, first source regions between two trench gate electrodes 3 and second source regions 75 between a trench gate electrode 3 and a p well 5 are created. The third insulating layer 38 can then be applied after the creation of the source regions 7, 75. The third insulating layer 38 covers the second source region 75, the electrically conductive layer 32 besides the recess 39 and leaves open a contact opening between two trench gate electrodes 3. An etch step is exemplarily performed in order to etch through a first source region 7 for the contact of the base layer 5 to the emitter electrode 2. By this method, the contact opening of the base layer 5 to the emitter electrode 2 is arranged in a plane below the emitter side 11. The emitter side 11 of the wafer shall be the most outer plane, in which layers or regions are arranged in the wafer parallel at the side, at which the emitter electrode 2 is arranged.

Alternatively, source regions are created with a mask, which covers a central area between two trench gate electrodes 3 for the contact of the base layer 5 to the emitter electrode 3.

Finally, an emitter electrode 2 and a collector electrode 25 are made.

The dopants can be introduced by any appropriate method like implantation or deposition, for example. Diffusion steps can be made directly after the introducing of the corresponding dopant, but can also be performed at a later stage, for example, for the base layer 4, the p well 5 being made with a diffusion step, their doping profile decreases from a maximum value steadily to the maximum diffusion depth of the dopant (which depends on the dopant sort and the diffusion conditions like diffusion time and temperature). It should be noted that the term "comprising" does not exclude other elements or steps and that the indefinite article "a" or "an" does not exclude the plural. Also, elements described in association with different embodiments can be combined.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 IGBT
10 wafer
11 Emitter side
12 First side
15 Collector side
16 Second side
100 active cell
110 dummy cell
120, 130, 140, 150, 160 known IGBT
2 Emitter electrode
25 Collector electrode
3 Trench gate electrode
31 Planar gate
300 Pitched trench gate
32 Electrically conductive layer
34 First insulating layer
36 Second insulating layer
38 Third insulating layer
39 Recess
4 Base layer
5 Well
6 Enhancement layer
7 First source region
75 Second source region
8 Drift layer
85 Buffer layer
9 Collector layer
95 First region

What is claimed is:

1. An insulated gated bipolar transistor having layers between an emitter electrode on an emitter side and a collector electrode on a collector side opposite to the emitter side, the insulated gate bipolar transistor comprising:
a drift layer of a first conductivity type;
a collector layer of a second conductivity type different than the first conductivity type, the collector layer being arranged between the drift layer and the collector electrode and electrically contacting the collector electrode;

a base layer of a second conductivity type, the base layer being arranged between the drift layer and the emitter electrode, the base layer electrically contacting the emitter electrode;

a first source region of the first conductivity type, the first source region being arranged on the base layer towards the emitter side and electrically contacting the emitter electrode, the first source region having a higher doping concentration than the drift layer;

a trench gate electrode arranged lateral to the base layer and extending deeper into the drift layer than the base layer, the trench gate electrode being separated from the base layer, the first source region and the drift layer by a first insulating layer, wherein a channel is formable between the emitter electrode, the first source region, the base layer and the drift layer;

a well of the second conductivity type, which is arranged lateral to the base layer and extends deeper into the drift layer than the base layer;

an enhancement layer of the first conductivity type, which surrounds the base layer such that the enhancement layer completely separates the base layer from the drift layer and the well;

in addition to the emitter electrode, an electrically conducting layer, which covers the well, wherein the electrically conductive layer is separated from the well by a second electrically insulating layer; and a third insulating layer, which is arranged on the emitter side on top of the trench gate electrode, the electrically conductive layer and those parts of the base layer, the enhancement layer and the drift layer lying between the trench gate electrode and the well, the third insulating layer having a recess on top of the electrically conducting layer such that the electrically conducting layer electrically contacts the emitter electrode.

2. The insulated gated bipolar transistor according to claim 1, comprising:

a second source region of the first conductivity type arranged at the emitter side on the base layer between the trench gate electrode and the well, wherein the second source region extends from the first electrically insulating layer to a border of the second electrically insulating layer, the second source region having a higher doping concentration than the drift layer.

3. The insulated gated bipolar transistor according to claim 1, wherein the well extends deeper into the drift layer than the trench gate electrode.

4. The insulated gated bipolar transistor according to claim 1, comprising:

a buffer layer of the first conductivity type having a higher doping concentration than the drift layer and being arranged between the drift layer and the collector layer.

5. The insulated gated bipolar transistor according to claim 1, comprising:

a first region of the first conductivity type, the first region being arranged on the collector side laterally to the collector layer and having a higher doping concentration than the drift layer.

6. The insulated gated bipolar transistor according to claim 1, wherein the electrically conductive layer is made of the same material as the trench gate electrode.

7. The insulated gated bipolar transistor according to claim 1, comprising:

a bar of the second conductivity type having a higher doping concentration than the base layer, the bar being arranged at the emitter side in a plane parallel to the emitter side perpendicular to a direction in which the first source region attaches the trench gate electrode and at which bar the first source region, the base layer and the trench gate electrode terminate.

8. The insulated gated bipolar transistor according to claim 7, wherein the well extends to the bar.

9. The insulated gated bipolar transistor according to claim 7, wherein the well is separated from the bar by at least one of the enhancement layer and the base layer.

10. The insulated gated bipolar transistor according to claim 1, wherein the electrically conducting layer additionally covers part of the enhancement layer which extends to the emitter side in an area between the well and the first insulating layer, and extends to a region above the base layer, and wherein the electrically conducting layer is separated from these layers by the second electrically insulating layer.

11. The insulated gated bipolar transistor according to claim 1, wherein the drift layer extends to the second electrically insulating layer in an area between the well and the enhancement layer.

12. The insulated gated bipolar transistor according to claim 1, wherein the second electrically insulating layer has a thickness between 50 to 150 nm.

13. The insulated gated bipolar transistor according to claim 2, wherein the well extends deeper into the drift layer than the trench gate electrode.

14. The insulated gated bipolar transistor according to claim 13, comprising:

a buffer layer of the first conductivity type having a higher doping concentration than the drift layer and being arranged between the drift layer and the collector layer.

15. The insulated gated bipolar transistor according to claim 13, comprising:

a bar of the second conductivity type having a higher doping concentration than the base layer, the bar being arranged at the emitter side in a plane parallel to the emitter side perpendicular to a direction in which the first source region attaches the trench gate electrode and at which bar the first source region, the base layer and the trench gate electrode terminate.

16. The insulated gated bipolar transistor according to claim 15, wherein the well extends to the bar.

17. The insulated gated bipolar transistor according to claim 15, wherein the well is separated from the bar by at least one of the enhancement layer and the base layer.

18. The insulated gated bipolar transistor according to claim 13, wherein the electrically conducting layer additionally covers part of the enhancement layer which extends to the emitter side in an area between the well and the first insulating layer, and extends to a region above the base layer, and wherein the electrically conducting layer is separated from these layers by the second electrically insulating layer.

19. A method for manufacturing an insulated gated bipolar transistor, the method comprising:

providing a lowly doped wafer of a first conductivity type having an emitter side and a collector side, part of the wafer having unamended low doping in the finalized insulated gated bipolar transistor forming a drift layer;

applying a mask and introducing a first dopant of a second conductivity type, which is different than the first conductivity type, for forming a well;

making a trench recess on the emitter side;

coating the trench recess with a first insulating layer and filling the coated trench recess with an electrically conductive material such that a trench gate electrode is formed;

forming a second insulating layer which covers the well;

forming an electrically conductive layer on top of the second insulating layer;

creating an enhancement layer by introducing a second dopant of the first conductivity type and diffusing the second dopant into the wafer using the electrically conductive layer as a mask;

after introduction of the second dopant, creating a base layer by introducing a third dopant of the second conductivity type, using the electrically conductive layer as a mask, and diffusing the third dopant into the wafer to a lower depth from the emitter side, into which the second dopant has been diffused;

creating a collector layer by introducing a fourth dopant of the second conductivity type on the collector side, and diffusing the fourth dopant into the wafer;

introducing a fifth dopant of the first conductivity type using at least the electrically conductive layer as a mask for forming first source regions;

applying a third insulating layer on top of the electrically conductive layer, the third insulating layer having a recess on the electrically conductive layer for a contact of the electrically conductive layer to the emitter electrode and a contact opening to the base layer; and applying an emitter electrode and a collector electrode.

20. The method for manufacturing an insulated gated bipolar transistor, according to claim 19, comprising:

first applying the third insulating layer on top of the electrically conductive layer such that the third insulating layer laterally extends to the trench gate electrode, the third insulating layer having a contact opening to the base layer; and introducing the fifth dopant of the first conductivity type using the third insulating layer and the electrically conductive layer as a mask for forming first source regions.

* * * * *